United States Patent [19]

Matsuda et al.

[11] Patent Number: 5,246,744
[45] Date of Patent: Sep. 21, 1993

[54] METHOD OF FORMING THIN FILM OF AMORPHOUS SILICON BY PLASMA CVD

[75] Inventors: Akihisa Matsuda, Ibaraki; Satoshi Mashima, Mie; Makoto Toda, Mie; Kouji Fujita, Mie, all of Japan

[73] Assignees: Central Glass Company, Limited, Ube City; Agency of Industrial Science and Technology, Tokyo, both of Japan

[21] Appl. No.: 797,987

[22] Filed: Nov. 26, 1991

[30] Foreign Application Priority Data

Nov. 30, 1990 [JP] Japan .................. 2-334180
Apr. 26, 1991 [JP] Japan .................. 3-95954

[51] Int. Cl.⁵ .................. B05D 3/06; C23C 16/00
[52] U.S. Cl. .................. 427/574; 427/573; 427/578; 427/255.1; 427/248.1; 427/314
[58] Field of Search ............ 427/38, 39, 255.1, 248.1, 427/314, 574, 573, 578

[56] References Cited

U.S. PATENT DOCUMENTS 4,492,736  1/1985  Tanner .................. 428/446
4,521,447  6/1985  Ovshinsky et al. .................. 427/45.1

FOREIGN PATENT DOCUMENTS 57-99725   6/1982  Japan .
59-54274   3/1984  Japan .
62-7859    1/1987  Japan .
63-84079   4/1988  Japan .
1-294866  11/1989  Japan .
2-219284   8/1990  Japan .

OTHER PUBLICATIONS

Schmitt; Thin Solid Films, vol. 174, No. 1 (Jul. 1989), pp. 193-202 Amorphous Silicon Deposition: Industrial and Technical Challenges.

*Primary Examiner*—Roy King
*Attorney, Agent, or Firm*—Keck, Mahin & Cate

[57] ABSTRACT

The invention relates to a plasma CVD method for the deposition of a thin film of amorphous silicon, or an amorphous silicon alloy, on a substrate by glow discharge decomposition of a raw material gas such as silane gas. The degradation of the photoconductivity of the obtained amorphous silicon film by irradiation with light is suppressed by mixing xenon gas with the raw material gas such that at the entrance to the reaction chamber the volume ratio of xenon gas to the raw material gas is not less than 1 and, preferably, not more than 30. A nearly comparable effect can be gained, and the material cost can be reduced, by mixing 1 part by volume of the raw material gas with 0.05 to 1 part of xenon gas and 5 to 30 parts of hydrogen gas.

18 Claims, 2 Drawing Sheets

METHOD OF FORMING THIN FILM OF AMORPHOUS SILICON BY PLASMA CVD

BACKGROUND OF THE INVENTION

Thin films of amorphous silicon (abbreviated to a-Si) are important for solar cells and many other photoelectronic devices. Usually thin films of a-Si are formed by a chemical vapor deposition (CVD) method, and currently it is prevailing to employ a plasma CVD method which uses glow discharge to produce a non-equilibrium and reactive plasma by decomposing a raw material gas such as silane gas. The plasma CVD method is advantageous in that a film of a-Si can be deposited on a substrate at a relatively low temperature and that a-Si films of fairly large areas can easily be obtained.

With respect to a-Si films formed by the conventional CVD methods, a serious problem is that the photoelectronic properties of the films are considerably degraded by irradiation with light. The degradation is known as the Staebler-Wronski effect and is represented by a considerable decrease in the photoconductivity. For example, by irradiation with light the photoconductivity of an intrinsic a-Si film decreases to the extent of about 1/10 of the initial value.

Much efforts have been directed to a solution of the photo-induced degradation problem, but a really satisfactory result has not been obtained yet. For example, JP 59-54274 A proposes to introduce a small amount of an element of the Group V, such as nitrogen, into an a-Si film deposited by the plasma CVD method by mixing a hydride gas such as $NH_3$ gas with the silane gas. JP 63-84079 A relates to a hydrogenated amorphous silicon film and proposes to regulate the CVD operation conditions such that in the hydrogenated amorphous silicon only less than about 1% of silicon atoms bond to two hydrogen atoms, respectively. JP 2-219284 A proposes to mix helium gas with silane gas in the proportion of, for example, about 5:1 by volume. However, these measures are not yet sufficiently effective for suppression of the photodegradation of the obtained a-Si films.

Meanwhile, in respect of the rate of growth of an a-Si film in the plasma CVD method, JP 1-294866 A proposes to mix silane gas with up to 2 vol % of xenon gas for the purpose of promoting the decomposition and activation of silane gas and thereby enhancing the film growth rate without degrading the properties of the obtained film.

Also it is known to produce a-Si films by a photo-initiated CVD method with a view to obviating a problem in the plasma CVD method that the properties of the obtained films may be adversely affected by mobile ions and radiation. However, the photo-initiated CVD method also has some inherent disadvantages, and at present this method is not favorable for practical manufacture of a-Si films.

SUMMARY OF THE INVENTION

The present invention relates to a plasma CVD method for forming a thin film of amorphous silicon or an amorphous silicon alloy on a substrate, and it is an object of the invention to provide an improved method which is very effective for suppression of the degradation of the obtained film by irradiation with light.

The invention provides a plasma CVD method for forming a thin film of amorphous silicon on a substrate placed in a reaction chamber, the method having the steps of evacuating the reaction chamber and keeping the substrate heated at a predetermined temperature, introducing a silicon compound gas into the reaction chamber so as to maintain a partial vacuum in the reaction chamber, making a glow discharge in the reaction chamber so as to decompose the silicon compound gas and produce a reactive plasma in the vicinity of the substrate thereby depositing amorphous silicon on the substrate, the method being characterized in that xenon gas is mixed with the silicon compound gas such that at the entrance to the reaction chamber the volume ratio of xenon gas to the silicon compound gas is not less than 1.

As is usual, silane or disilane gas is preferred as the gaseous silicon compound.

In the case of using this invention to form a thin film of an amorphous silicon alloy, the silicon compound gas in the above stated method is replaced by a mixture of a silicon compound gas and a gaseous compound of the alloying element, and xenon gas is added to the mixed raw material gas such that the volume ratio of xenon gas to the mixed raw material gas is not less than 1 at the entrance to the reaction chamber.

Unexpectedly we have discovered that by mixing a relatively large amount of xenon gas with a silicon compound gas to be decomposed by glow discharge the photodegradation of the obtained a-Si film, particularly in respect of the photoconductivity, is remarkably suppressed. The favorable effect of the presence of xenon is probably attributed to the following phenomena.

Among the reactive species which will exist in the plasma produced by the glow discharge decomposition of silane gas, $SiH_3$ is believed to be favorable for the deposition of an a-Si film of good quality whereas $SiH_2$ is rather unfavorable. The dissociation energy of $SiH_4$ to $SiH_3$ is 8.75 eV, and the dissociation energy of $SiH_4$ to $SiH_2$ is 9.47 eV. Since xenon in a long-lived excited state has energy of 8.32 eV, $SiH_2$ is not readily formed by the collision of silane with excited xenon in the vicinity of the film-growing surface. Since the film growing surface is scattered with considerable amount of xenon which has a relatively large diameter (d=4.4 Å), the migration or diffusion of the film forming radical such as $SiH_3$ is suppressed. Therefore, crystallization of the growing film is prevented, and microvoids attributed to agglomeration of hydrogen atoms are introduced into the amorphous network structure.

We have further discovered that the photo-induced degradation of a thin film of a-Si formed by a plasma CVD method can be suppressed by mixing the raw material gas such as silane gas with a relatively small amount of xenon gas and a relatively large amount of hydrogen gas. That is, besides the method stated hereinbefore and as a modification of that method, the invention provides a plasma CVD method for forming a thin film of a-Si on a substrate, the modified method being characterized in that the silicon compound gas is mixed with xenon gas and hydrogen gas such that the volume ratio of xenon gas to the silicon compound gas is in the range from 0.05 to 1 at the entrance to the reaction chamber and such that the volume ratio of hydrogen gas to the silicon compound gas is in the range from 5 to 30 at the entrance to the reaction chamber.

In the case of using the modified method to form a thin film of an amorphous silicon alloy by using a mixture of a silicon compound gas and a gaseous compound of the alloying element, xenon gas and hydrogen gas are added to the mixed raw material gas such that the volume ratio of xenon gas to the mixed raw material gas is in the range from 0.05 to 1 and such that the volume ratio of hydrogen gas to the mixed raw material gas is in the range from 5 to 30.

This modification brings about a considerable reduction in material cost since the quantity of expensive xenon gas is decreased by jointly using relatively inexpensive hydrogen gas, though a slight difference will occur in the capability of suppressing the photo-induced degradation of the obtained a-Si film.

In the modified method the functions of xenon are as described hereinbefore. Hydrogen serves as an aid and has the effect of improving the quality of the deposited amorphous film.

The present invention can readily be put into practice by using a conventional plasma CVD apparatus without modification in the main parts. Of course the invention is very useful for the manufacture of amorphous silicon films for solar cells and other photoelectronic devices.

DESCRIPTION OF THE PREFERRED EMBODIMENTS

In this invention a film of a-Si or an amorphous silicon alloy is deposited on a substrate. The material of the substrate is not limited and can be selected from conventional substrate materials including glass, ceramics and metals represented by aluminum and stainless steel.

To form a film of a-Si by a method according to the invention it is preferred to use silane ($SiH_4$) gas, disilane ($Si_2H_6$) gas or a mixed gas of silane and disilane as the raw material gas. In the case of forming a film of an amorphous silicon alloy a gaseous compound of the alloying element is used together with silane or disilane. For example, a mixture of germane ($GeH_4$) gas and silane or disilane gas can be used to form a film of amorphous SiGe, and a mixture of methane gas and silane or disilane gas to form a film of amorphous SiC. In the following description silane gas is taken as a representative of the raw material gas.

The first method according to the invention uses a mixture of 1 part by volume of silane gas with at least 1 part by volume of xenon gas. If the volume ratio of xenon to silane is less than 1 the photodegradation suppressing effect of the addition of xenon gas is insufficient, and it is preferable that the volume ratio of xenon to silane is in the range from 2 to 30. Under suitable plasma CVD operation conditions the effect of the addition of xenon gas reaches nearly the maximum before increasing the $Xe/SiH_4$ ratio up to 30, and the use of a larger amount of xenon gas is economically unfavorable.

The second method according to the invention uses a mixture of 1 part by volume of silane gas, 0.05 to 1 part by volume of xenon gas and 5 to 30 parts by volume of hydrogen gas. If the $Xe/SiH_4$ ratio is less than 0.05 or the $H_2/SiH_4$ ratio is less than 5 the photodegradation suppressing effect of the joint addition of xenon and hydrogen is insufficient. When the $Xe/SiH_4$ ratio is made more than 1 the obtained a-Si film tends to become relatively high in dark conductivity, and the material cost increases. When the $H_2/SiH_4$ ratio is more than 30 the obtained a-Si film may not be very good in quality, and if this ratio reaches about 50 there arises a possibility of peeling of the deposited a-Si film from the substrate. It is preferable to mix 1 part by volume of silane gas with 0.1 to 0.9 part by volume of xenon gas and 5.5 to 25 parts by volume of hydrogen gas.

The apparatus for performing a method according to the invention is substantially similar to the apparatus for conventional plasma CVD methods. It suffices to modify the raw material gas introducing conduits so as to introduce xenon gas, or xenon gas and hydrogen gas, into the reaction chamber together with silane gas. Either a high-frequency power or a DC voltage can be used for making a glow discharge in the reaction chamber.

Figure 1:
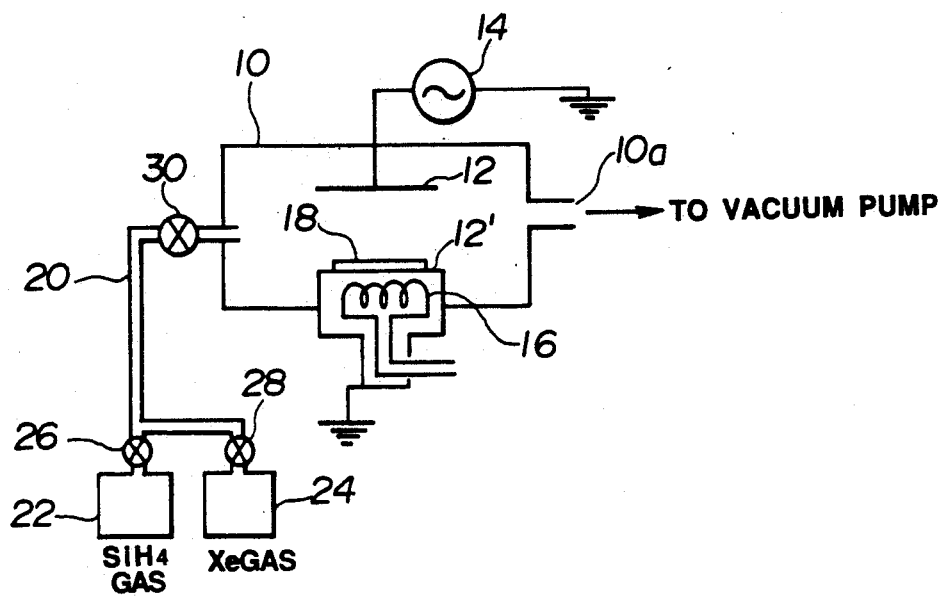
FIG. 1 is a diagrammatic illustration of a plasma CVD apparatus for use in the present invention.

FIG. 1 shows an example of CVD apparatus for a method according to the invention. The main component of the apparatus is a reaction chamber 10 which is a vacuum chamber. That is, a discharge port 10a of the reaction chamber 10 is connected to a vacuum pump (not shown). In the reaction chamber 10 a pair of planar electrodes 12 and 12' for glow discharge are set in a parallel arrangement. The chamber 10 is circular in cross sections, and the planar electrodes 12, 12' are circular and concentrical with the chamber 10. The upper electrode 12 is connected to a high-frequency power supply 14. The lower electrode 12' is grounded, and a substrate 18 can be placed on this electrode 12'. To heat the substrate 18, the electrode 12' is provided with a heater 16. A gas introducing conduit 20 extends from the reaction chamber 10 to a silane gas supply 22 and a xenon gas supply 24 and is provided with control valves 26, 28, 30.

In operation, the substrate 18 is placed on the electrode 12', and the reaction chamber 10 is evacuated to a high vacuum (e.g. $1 \times 10^{-6}$ to $1 \times 10^{-8}$ Torr) while the valve 30 is closed. The substrate 18 is kept heated at a predetermined temperature ranging from about 200° C. to about 300° C., and the valves 26, 28, 30 are opened to introduce a predetermined mixture of silane gas and xenon gas by regulating the flow rates of the respective gases so as to maintain a predetermined total pressure (e.g. 10 to 200 mTorr) in the reaction chamber 10. In such a state a high-frequency power is applied to the electrodes 12, 12' from the high-frequency powder supply 14 (usually operating at 13.56 MHz) at a predetermined power density ranging from about 0.03 W/cm² to about 0.8 W/cm² in order to make a glow discharge. The glow discharge causes decomposition of silane gas and produces a reactive plasma in the reaction chamber 10 in the region between the opposite electrodes 12 and 12', and consequently a thin film of a-Si is deposited on the exposed surface of the substrate 18. The operation is continued until the deposited film grows to a desired thickness.

EXAMPLE 1

Using the plasma CVD apparatus shown in FIG. 1, an a-Si film was deposited on a glass substrate (18) by glow discharge decomposition of a mixed gas of $SiH_4$ and Xe. The glass substrate was kept heated at about 250° C. In preparing the mixed gas the volume ratio of Xe to $SiH_4$ was varied over the range from 1 to 30 by controlling the flow rates of Xe gas and $SiH_4$ gas, and the mixed gas was introduced into the reaction chamber so as to maintain a total pressure of about 30 mTorr in the chamber. The power density of the high-frequency (13.56 MHz) power was varied over the range from 0.03 to 0.53 W/cm$^2$. In every case an a-Si film having a thickness of 0.5–0.6 μm was deposited on the glass substrate.

Figure 2:
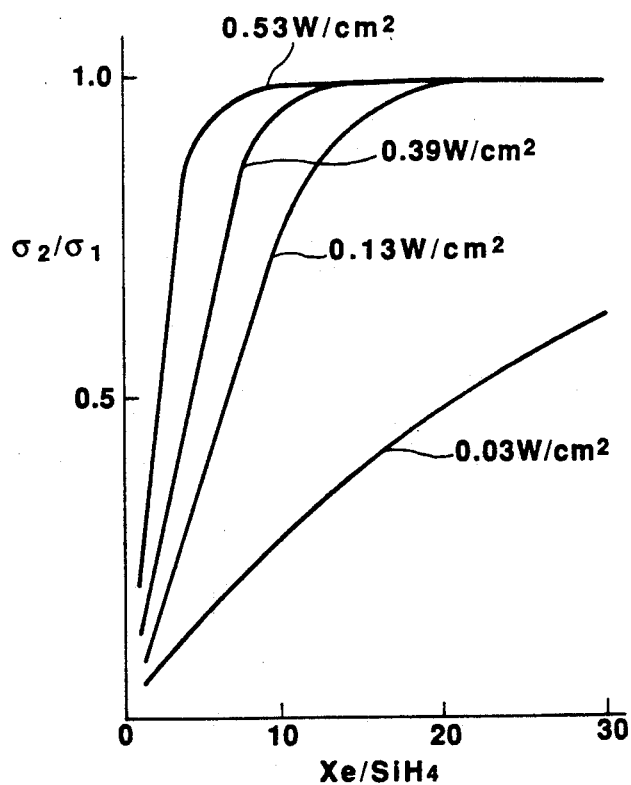
FIG. 2 is a graph showing the relationship between the volume ratio of xenon gas to silane gas used to deposit an a-Si film by a method according to the invention and the rate of photodegradation of the photoconductivity of the obtained film with respect to several films deposited at various power densities.

The photoconductivities of the obtained a-Si films were measured. After that the films were irradiated with simulated sunlight (AM-1) at a density of 100 mW/cm$^2$ for about 500 hr, and then the photoconductivities were measured to evaluate the degree of degradation by the ratio of the photoconductivity value ($\sigma_2$) after the irradiation to the initial photoconductivity value ($\sigma_1$). The results, as shown in FIG. 2, indicate that the degree of photodegradation, $\sigma_2/\sigma_1$, depend on the volume ratio of Xe gas to $SiH_4$ gas and also on the power density for glow discharge. It is seen that the change in the photoconductivity can be made small by increasing the Xe/$SiH_4$ ratio, though it is unnecessary to increase the Xe/$SiH_4$ beyond 30 insofar as the glow discharge decomposition is carried out at an adequate power density.

COMPARATIVE EXAMPLE 1

The plasma CVD operation of Example 1 was modified by omitting the addition of xenon gas to silane gas. The glow discharge decomposition of silane gas was made at a power density of 0.03 W/cm$^2$.

Figure 3:
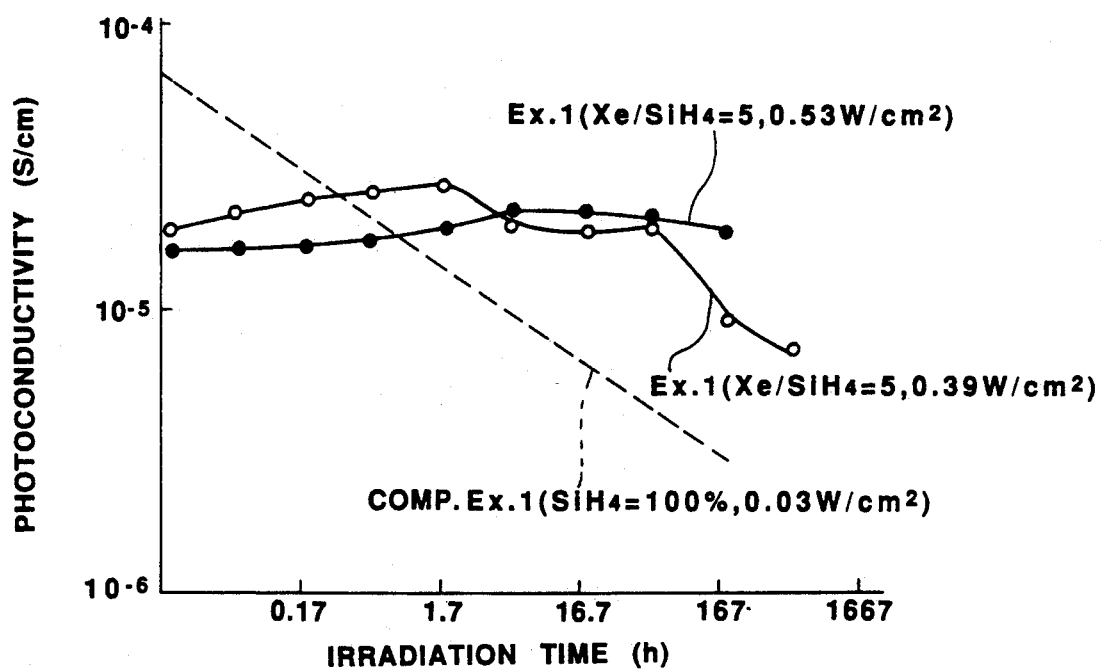
FIG. 3 is a graph showing the manner of changes in the photoconductivity of an a-Si film by irradiation with light with respect to two films deposited by a method according to the invention and another film deposited by a method not in accordance with the invention.

The a-Si film obtained in Comparative Example 1 and a few of the a-Si films obtained in Example 1 were irradiated with simulated sunlight, and the photoconductivity of each film was measured at regular intervals to examine the rate of decrease in photoconductivity. The results are shown in FIG. 3.

EXAMPLES 2–9

In every example an a-Si film was formed on a glass substrate by glow discharge decomposition of a mixed gas of $SiH_4$, Xe and $H_2$, using an apparatus of the type shown in FIG. 1. The proportions of the three kinds of gases were varied as shown in Table 1. In every case the mixed gas was introduced into the reaction chamber so as maintain a total pressure of about 100 mTorr in the chamber. The substrate temperature was constantly about 250° C., and the power density for glow discharge was constantly 0.1 W/cm$^2$. In every example an a-Si film having a thickness of 0.5–0.6 μm was deposited on the glass substrate.

The photoconductivity ($\sigma_p$) and dark conductivity ($\sigma_d$) of the a-Si film obtained in each example were as shown in Table 1.

The a-Si film obtained in every example was irradiated with simulated sunlight (AM-1) at a density of 100 mW/cm$^2$ for about 167 h, while the photoconductivity was measured at regular intervals. The measured photoconductivity values were used to determine the rate of photodegradation, which is defined as the slope of the photoconductivity, $\sigma_p$(S/cm), versus irradiation time, t (h), plotted on a log-log scale. That is, if the irradiation with light causes no change in the photoconductivity of the a-Si film the photodegradation rate, $-\log \sigma_p/\log t$, becomes 0 (zero). The results are shown in Table 1. As can be seen in Table 1, the a-Si film obtained in every example was sufficiently high in the initial photoconductivity and fairly low in the initial dark conductivity: between $\sigma_p$ and $\sigma_d$ there was a difference by about six orders of magnitude. Moreover, the photodegradation rate was very low.

TABLE 1

| | Gas: Flow Rate (SCCM) | Proporsions of $H_2$ and Xe | Initial Photoconductivity, $\sigma_p$ ($\Omega^{-1}.cm^{-1}$) | Initial Dark Conductivity, $\sigma_d$ ($\Omega^{-1}.cm^{-1}$) | Photodegradation Rate, $-\log \sigma_p/\log t$ |
|---|---|---|---|---|---|
| Ex. 2 | $SiH_4$: 5<br>$H_2$: 25<br>Xe: 5 | $H_2/SiH_4 = 5$<br>$Xe/SiH_4 = 1$ | $4.7 \times 10^{-5}$ | $2.2 \times 10^{-11}$ | 0.11 |
| Ex. 3 | $SiH_4$: 2<br>$H_2$: 25<br>Xe: 2 | $H_2/SiH_4 = 12.5$<br>$Xe/SiH_4 = 1$ | $5.9 \times 10^{-4}$ | $6.9 \times 10^{-10}$ | 0.25 |
| Ex. 4 | $SiH_4$: 2<br>$H_2$: 25<br>Xe: 1 | $H_2/SiH_4 = 12.5$<br>$Xe/SiH_4 = 0.5$ | $2.0 \times 10^{-5}$ | $2.8 \times 10^{-11}$ | <0.01 |
| Ex. 5 | $SiH_4$: 5<br>$H_2$: 25<br>Xe: 2.5 | $H_2/SiH_4 = 5$<br>$Xe/SiH_4 = 0.5$ | $4.9 \times 10^{-5}$ | $3.3 \times 10^{-11}$ | 0.15 |
| Ex. 6 | $SiH_4$: 10<br>$H_2$: 50<br>Xe: 1 | $H_2/SiH_4 = 5$<br>$Xe/SiH_4 = 0.1$ | $2.4 \times 10^{-5}$ | $3.8 \times 10^{-11}$ | 0.04 |
| Ex. 7 | $SiH_4$: 10<br>$H_2$: 50<br>Xe: 0.6 | $H_2/SiH_4 = 5$<br>$Xe/SiH_4 = 0.06$ | $8.2 \times 10^{-5}$ | $5.7 \times 10^{-11}$ | 0.18 |
| Ex. 8 | $SiH_4$: 5<br>$H_2$: 40<br>Xe: 3 | $H_2/SiH_4 = 8$<br>$Xe/SiH_4 = 0.6$ | $3.7 \times 10^{-5}$ | $3.7 \times 10^{-10}$ | 0.08 |
| Ex. 9 | $SiH_4$: 2<br>$H_2$: 50<br>Xe: 1 | $H_2/SiH_4 = 25$<br>$Xe/SiH_4 = 0.5$ | $3.7 \times 10^{-5}$ | $4.5 \times 10^{-10}$ | 0.15 |

COMPARATIVE EXAMPLES 2–8

As shown in Table 2, the foregoing examples were modified by omitting the addition of Xe gas and $H_2$ gas or by using a rare gas different from Xe gas, or by greatly varying the proportion of Xe gas or $H_2$ gas. The substrate temperature, total pressure in the reaction chamber and the power density of glow discharge were the same as in Examples 2-9 except that in Comparative Example 2A the power density was changed to 0.03 W/cm$^2$.

The photoconductivity and dark conductivity of the obtained a-Si films were as shown in Table 2. The a-Si film deposited in Comparative Example 8 was inferior in qualtity, and peeling of the film from the substrate was appreciable. The a-Si films obtained in Comparative Examples 2-7 were subjected to the photodegradation test described with respect to Examples 2-9. As shown in Table 2, the a-Si films of Comparative Examples 2-6 exhibited relatively high rates of photodegradation. The a-Si film of Comparative Example 7 was very low in the photodegradation rate, but this film was considerably high in the initial dark conductivity.

TABLE 2

| | Gas: Flow Rate (SCCM) | Proporsions of H$_2$ and Xe (or He, Ne or Ar) | Initial Photoconductivity, $\sigma_p$ ($\Omega^{-1}$.cm$^{-1}$) | Initial Dark Conductivity, $\sigma_d$ ($\Omega^{-1}$.cm$^{-1}$) | Photodegradation Rate, $-\log \sigma_p/\log t$ |
|---|---|---|---|---|---|
| Comp. Ex. 2A | SiH$_4$: 5 | — | $4.5 \times 10^{-5}$ | $1.5 \times 10^{-10}$ | 0.31 |
| Comp. Ex. 2B | SiH$_4$: 5 | — | $3.8 \times 10^{-5}$ | $3.2 \times 10^{-11}$ | 0.33 |
| Comp. Ex. 3 | SiH$_4$: 5 He: 25 | He/SiH$_4$ = 5 | $8.9 \times 10^{-5}$ | $3.1 \times 10^{-10}$ | 0.45 |
| Comp. Ex. 4 | SiH$_4$: 5 Ne: 25 | Ne/SiH$_4$ = 5 | $1.4 \times 10^{-4}$ | $4.6 \times 10^{-10}$ | 0.31 |
| Comp. Ex. 5 | SiH$_4$: 5 Ar: 25 | Ar/SiH$_4$ = 5 | $8.6 \times 10^{-5}$ | $6.0 \times 10^{-11}$ | 0.81 |
| Comp. Ex. 6 | SiH$_4$: 5 H$_2$: 25 Xe: 0.1 | H$_2$/SiH$_4$ = 5 Xe/SiH$_4$ = 0.02 | $8.2 \times 10^{-5}$ | $1.3 \times 10^{-11}$ | 0.34 |
| Comp. Ex. 7 | SiH$_4$: 2.5 H$_2$: 87.5 Xe: 0.75 | H$_2$/SiH$_4$ = 35 Xe/SiH$_4$ = 0.3 | $9.4 \times 10^{-4}$ | $3.7 \times 10^{-8}$ | <0.01 |
| Comp. Ex. 8 | SiH$_4$: 5 H$_2$: 270 Xe: 5 | H$_2$/SiH$_4$ = 54 Xe/SiH$_4$ = 1 | (film peeled) | — | — |

What is claimed is:

1. A plasma chemical vapor deposition method for forming a film of amorphous silicon on a substrate placed in a reaction chamber, the method comprising the steps of evacuating the reaction chamber and keeping the substrate heated at a temperature in a range from about 200° C. to about 300° C., introducing a silicon compound gas into the reaction chamber so as to maintain a partial vacuum in the reaction chamber, at a power density ranging from about 0.03 W/cm$^2$ to about 0.8 W/cm$^2$, making a glow discharge in the reaction chamber so as to decompose the silicon compound gas and produce a reactive plasma in the vicinity of the substrate thereby depositing said film of the amorphous silicon on the substrate, wherein xenon gas is mixed with said silicon compound gas such that at the entrance to the reaction chamber the volume ratio of the xenon gas to the silicon compound gas is not less than 1.

2. A method according to claim 1, wherein said silicon compound is selected from the group consisting of silane and disilane.

3. A method according to claim 2, wherein said volume ratio of the xenon gas to the silicon compound gas is not greater than 30.

4. A method according to claim 3, wherein said volume ratio of the xenon gas to the silicon compound gas is not less than 2.

5. A method according to claim 1, wherein said glow discharge is generated by a high-frequency power.

6. A plasma chemical vapor deposition method for forming a film of amorphous silicon on a substrate placed in a reaction chamber, the method comprising the steps of evacuating the reaction chamber and keeping the substrate heated at a temperature in a range from about 200° C. to about 300° C., introducing a silicon compound gas into the reaction chamber so as to maintain a partial vacuum in the reaction chamber, at a power density ranging from about 0.03 W/cm$^2$ to about 0.8 W/cm$^2$, making a glow discharge in the reaction chamber so as to decompose the silicon compound gas and produce a reactive plasma in the vicinity of the substrate thereby depositing said film of the amorphous silicon on the substrate, wherein xenon gas and hydrogen gas are mixed with said silicon compound gas such that the volume ratio of the xenon gas to the silicon compound gas is in the range from 0.05 to 1 at the entrance to the reaction chamber and such that the volume ratio of the hydrogen gas to the silicon compound gas is in the range from 5 to 30 at the entrance to the reaction chamber.

7. A method according to claim 6, wherein said silicon compound is selected from the group consisting of silane and disilane.

8. A method according to claim 7, wherein said volume ratio of the hydrogen gas to the silicon compound gas is in the range from 5.5 to 25.

9. A method according to claim 8, wherein said volume ratio of the xenon gas to the silicon compound gas is in the range from 0.1 to 0.9.

10. A method according to claim 6, wherein said glow discharge is generated by a high-frequency power.

11. In a plasma chemical vapor deposition method for forming a film of an amorphous silicon alloy on a heated substrate placed in a reaction chamber by glow discharge decomposition of a raw material gas which is a mixture of a gaseous silicon compound and a gaseous compound of an alloying element, the improvement comprising forming said film at a power density ranging from about 0.03 W/cm$^2$ to about 0.8 W/cm$^2$, wherein xenon gas is mixed with said raw material gas such that at the entrance to the reaction chamber the volume ratio of the xenon gas to the raw material gas is not less than 1.

12. A method according to claim 11, wherein said silicon compound is selected from the group consisting of silane and disilane.

13. A method according to claim 12, wherein said gaseous compound of said alloying element is germane.

14. A method according to claim 12, wherein said gaseous compound of said alloying element is methane.

15. In a plasma chemical vapor deposition method for forming a film of an amorphous silicon alloy on a heated substrate placed in a reaction chamber by glow discharge decomposition of a raw material gas which is a mixture of a gaseous silicon compound and a gaseous compound of an alloying element, the improvement comprising forming said film at a power density ranging from about 0.03 W/cm$^2$ to about 0.8 W/cm$^2$, wherein xenon gas and hydrogen gas are mixed with said raw material gas such that the volume ratio of the xenon gas to the raw material gas is in the range from 0.05 to 1 at the entrance to the reaction chamber and such that the volume ratio of the hydrogen gas to the raw material gas is in the range from 5 to 30 at the entrance to the reaction chamber.

16. A method according to claim 15, wherein said silicon compound is selected from the group consisting of silane and disilane.

17. A method according to claim 16, wherein said gaseous compound of said alloying element is germane.

18. A method according to claim 16, wherein said gaseous compound of said alloying element is methane.

* * * * *